United States Patent
Chen

(10) Patent No.: US 9,721,818 B2
(45) Date of Patent: Aug. 1, 2017

(54) PRESSURIZED GAS STOPPER FOR LEADFRAME TRANSPORTING APPARATUS

(71) Applicant: Texas Instruments Incorporated, Dallas, TX (US)

(72) Inventor: Kane Chen, New Taipai (TW)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 1059 days.

(21) Appl. No.: 13/689,130

(22) Filed: Nov. 29, 2012

(65) Prior Publication Data
US 2014/0148935 A1 May 29, 2014

(51) Int. Cl.
*G05B 15/02* (2006.01)
*B65G 43/00* (2006.01)
*H01L 21/677* (2006.01)
*H01L 21/67* (2006.01)

(52) U.S. Cl.
CPC .. *H01L 21/67721* (2013.01); *H01L 21/67259* (2013.01)

(58) Field of Classification Search
CPC ................ H01L 21/67721; H01L 21/67259
USPC ................................................. 700/112, 228
See application file for complete search history.

(56) References Cited

U.S. PATENT DOCUMENTS 5,987,722 A 11/1999 Park et al.
6,655,925 B1 * 12/2003 Robenalt et al. ............. 417/234

OTHER PUBLICATIONS

Google patent machine translation EP1097097B1.*

* cited by examiner

*Primary Examiner* — Ryan Jarrett
(74) *Attorney, Agent, or Firm* — Jacqueline J. Garner; Charles A. Brill; Frank D. Cimino

(57) ABSTRACT

An apparatus for transporting a leadframe sheet during semiconductor die assembly includes a rail having sub-rails defining a machine track and an inner space along which the leadframe sheet is moved. A position detector senses a position of the leadframe sheet as the leadframe sheet moves along the machine track. A controller including a processor is coupled to the position detector for receiving the position of the leadframe sheet. A pressurized gas stopper is positioned within the inner space including a gas distributor having at least one gas inlet for receiving a pressured gas supply and at least one gas outlet for directing a flow of gas toward the leadframe sheet sufficient to stop movement of the leadframe sheet. The controller provides control signals for controlling the flow of gas to provide non-contact stopping of the leadframe sheet at one or more locations along the machine track.

15 Claims, 5 Drawing Sheets

PRESSURIZED GAS STOPPER FOR LEADFRAME TRANSPORTING APPARATUS

FIELD

Disclosed embodiments relate to leadframe transport apparatus and methods of transporting leadframes for semiconductor assembly.

BACKGROUND

Conventional semiconductor chip-assembly processes begin with die-bonding where individual integrated circuit (IC) die having a plurality of interconnected circuit elements are separated from a wafer, which are then attached to the die pad of a leadframe by a die-bonding apparatus. The leadframes are part of a large leadframe sheet (or leadframe panel) including a 2-dimensional array of leadframes.

A leadframe transport apparatus including side rails is generally used for transporting the leadframes sheets through to the die-bonding apparatus and wire bonding apparatus. After wire bonding, the individual leadframes are electrically coupled to the IC die by bond wires or by directly bonding parts thereof to metal bond pads on the IC die using a wire bonding apparatus to form IC die assemblies. The IC die assemblies are then encapsulated to provide protection from environmental effects, such as moisture, and electrical shock. The packaged IC is then subjected to a cutting/forming process to cut and form the leads to adapt the package for mounting on a circuit board.

FIG. 1 is a perspective view of a conventional leadframe transport apparatus 100 including two rails including a first rail 150a and second rail 150b, having mechanical clampers 172. The rails 150a and 150b have the same structure. The width (W) of the machine track 160 defined by the spacing of the rails 150a and 150b is adjustable, depending on the W of the leadframe sheet (LDF) 116 which is to be transported.

Machine pusher 144 is shown for translating the LDF 116 from left to right in FIG. 1. As known in the art, other mechanisms for moving the LDF 116 include conveyor belts and a mobile base. When the LDF 116 reaches certain predetermined position(s) along the rails 150a/150b, a position sensor (not shown) detects the position of LDF 116 and a controller transmits a detection signal to an actuator which actuates the mechanical clamper (or stopper) 172 shown on rails 150a and 150b. The mechanical clamper 172 includes a feature which when actuated is projected downward that engages (contacts) the LDF 116 directly resulting in stopping the movement of the LDF 116. Since the moving and stopping of the LDF 116 is controlled by a controller, the machine pusher 144 can be depressed (so that it no longer pushes the LDF 116) when the mechanical clamper 172 is engaging (contacting) the LDF 116.

Conventional leadframe transport apparatus 100 has certain problems associated with the operation of the mechanical clamper 172. For example, the LDF 116 can miss a required transfer if the mechanical clamper 172 does not engage properly. Adjustments for proper function of the mechanical clamper 172 are known to be needed when material issues of the LDFs are found, such as in the case of a warped LDF 116. Adjustments are made manually, are known to be difficult, and can cause significant down time. If the mechanical clamper 172 is adjusted too tight, the LDF 116 can jam and as a result can be damaged. If the mechanical clamper 172 is adjusted too loose, the LDF 116 can fail to stop at its required position which can cause machine error. Due to the potential for jamming of the LDF 116, the translation speed utilized by conventional leadframe transport apparatus 100 reflected in its throughput generally measured in units per hour (UPH) can be significantly limited.

SUMMARY

Disclosed embodiments describe leadframe transport apparatus and methods of transporting a leadframe sheet (LDF) for semiconductor assembly featuring a non-contact pressurized gas flow-based LDF stopper, which may be contrasted with the mechanical clamper (or stopper) described relative to conventional leadframe transport apparatus 100 shown in FIG. 1. One embodiment comprises providing an apparatus for transporting a LDF during semiconductor die assembly including a rail having sub-rails defining a machine track and an inner space along which a LDF is moved. A position detector senses a position of the leadframe sheet as the LDF moves along the machine track. A controller including a processor is communicably coupled to the position detector for receiving the position of the LDF.

A pressurized gas stopper is positioned within the inner space including a gas distributor having at least one gas inlet for receiving a pressured gas supply and at least one gas outlet for directing a flow of gas toward the LDF sufficient to stop movement of the LDF. The controller provides control signals operable for controlling the flow of gas to provide non-contact stopping of the LDF at one or more locations along the machine track. Disclosed pressurized gas stoppers reduce the LDF jamming risk compared to mechanical clampers, allowing the throughput for the assembly process to be increased by increasing the velocity of the LDFs, while decreasing downtime due to a reduction in LDF jamming.

BRIEF DESCRIPTION OF THE DRAWINGS

Reference will now be made to the accompanying drawings, which are not necessarily drawn to scale, wherein.

DETAILED DESCRIPTION

Figure 1:
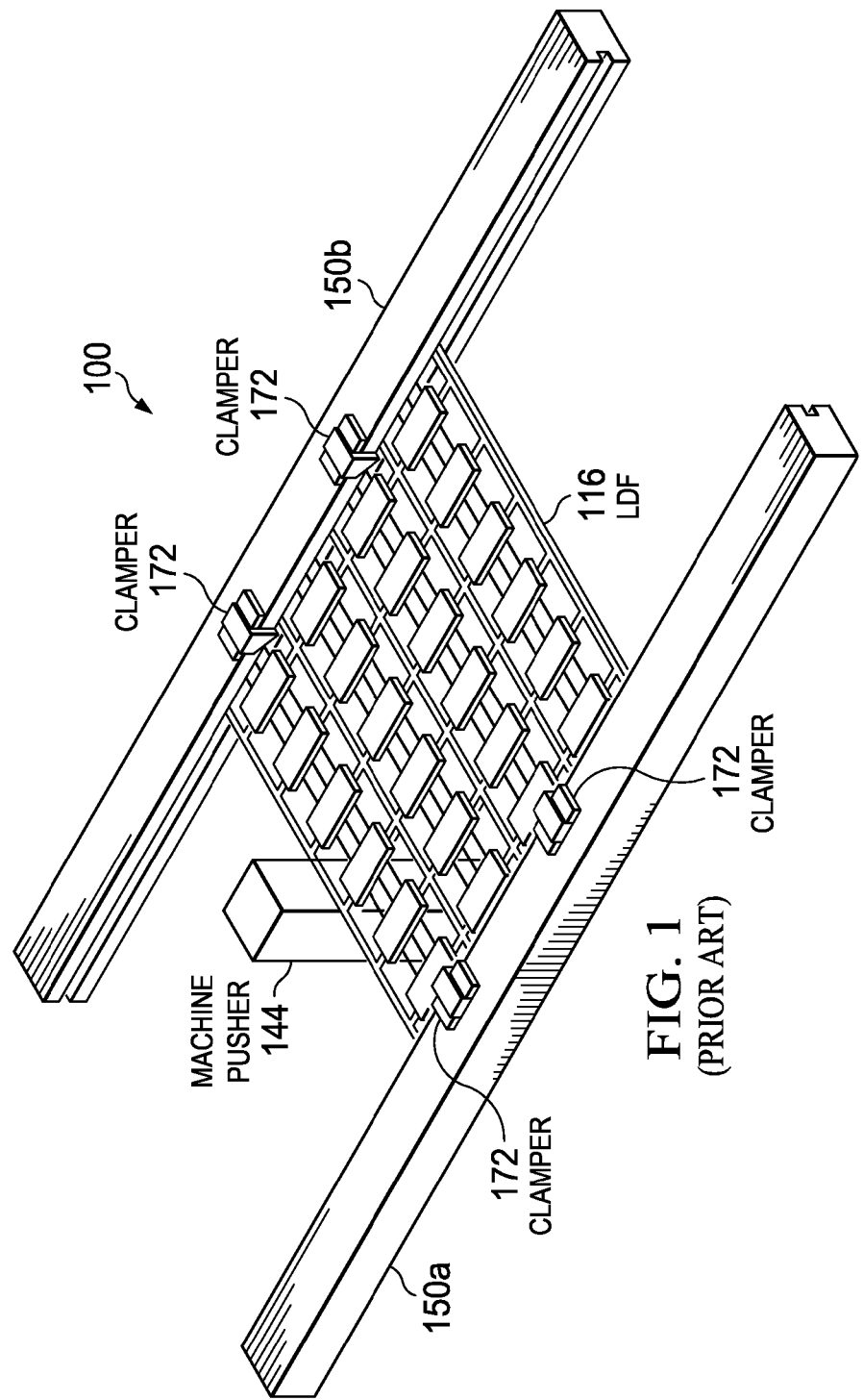
FIG. 1 is a perspective view of a conventional leadframe transport apparatus including two rails having a first rail and second rail, along with mechanical clampers for stopping the movement of the LDF.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Figure 2:
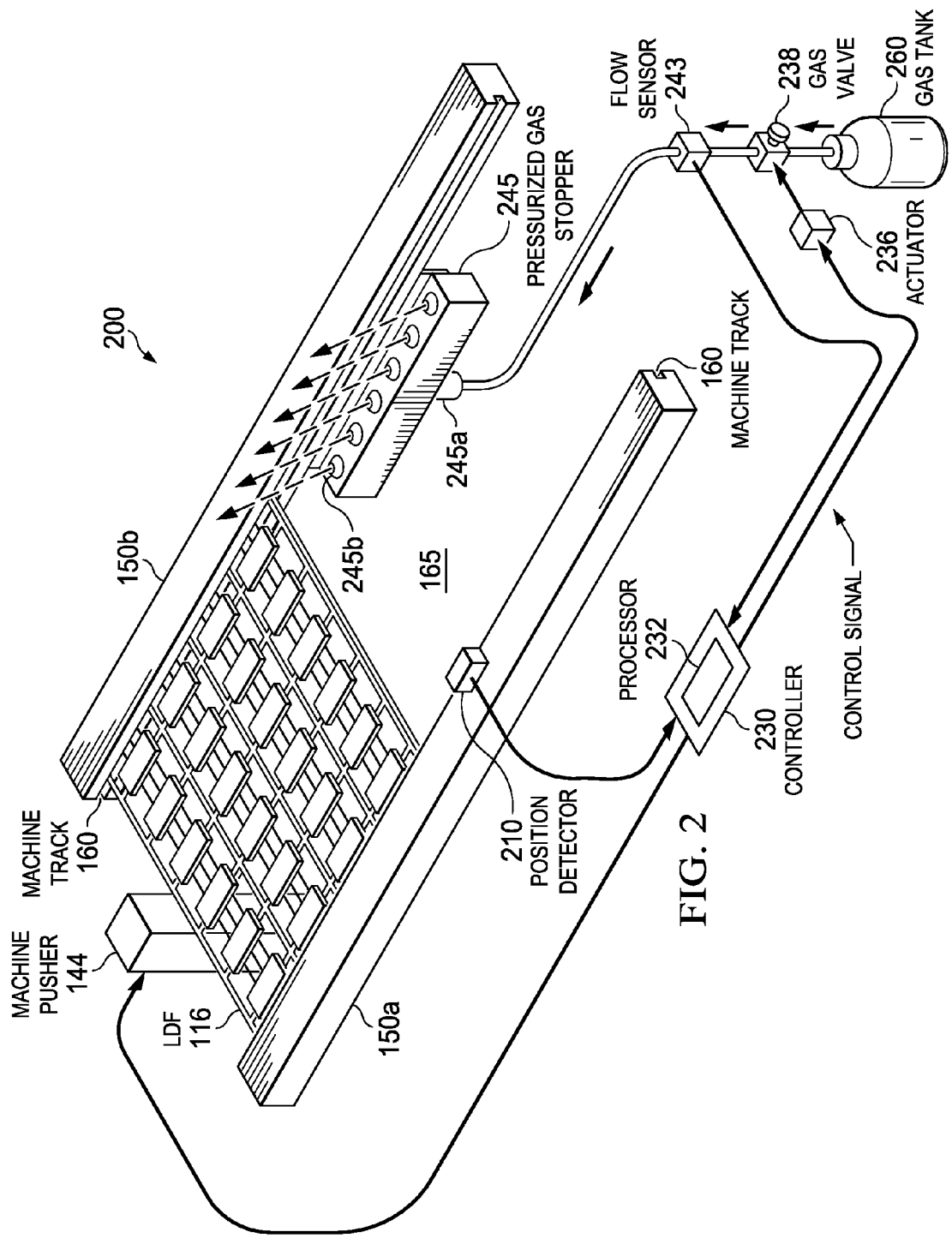
FIG. 2 is perspective view of an example leadframe transport apparatus enhanced with certain functional blocks for transporting a LDF during semiconductor die assembly including a pressurized gas stopper for stopping the movement of the LDF, according to an example embodiment.

FIG. 2 is perspective view of an example leadframe transport apparatus 200 enhanced with certain functional blocks for transporting a LDF during semiconductor die assembly including a pressurized gas stopper, according to an example embodiment. Apparatus 200 includes a rail comprising sub-rails 150a and 150b which define a machine track 160 and an inner space 165 along which the LDF 116 is moved left to right. A non-contact position detector 210 senses a position of the LDF 116 as the LDF 116 moves along the machine track 160.

The position detector 210 can comprise a variety of different position detector types, including light-based detectors, such as a convergent reflective sensor in one particular embodiment (e.g., Omron, E3T-SL21 Photoelectric Sensor having a built-in amplifier which provides a measurement range of about 5 to 30 mm (Omron Corporation)). A photoelectric sensor uses a beam of light to detect the presence or absence of an object. A controller 230 including a processor 232 is communicably coupled to the position detector 210 for receiving the position (position information) of the LDF 116 from the position detector 210. Communicably coupling as used herein can be over wired media (including optical) or wireless media (e.g., over the air).

A machine pusher 144 including a pusher motor (not shown) is provided for translating the LDF 116 from left to right in FIG. 2. Controller 230 is communicably coupled to the machine pusher 144.

A pressurized gas stopper 245 is positioned within the inner space 165 shown as a gas distributor having at least one gas inlet 245a for receiving a pressured gas supply provided by gas tank 260 or other pressured gas source such as a compressor, and at least one gas outlet 245b. Pressurized gas stopper 245 is for directing a flow of gas toward the LDF 116 with sufficient gas flow in the flow orientation utilized to provide a force that results in stopping the movement of the LDF 116.

Although a plurality of gas outlets 245b are shown in FIG. 2, a single gas outlet can generally provide the same LDF stopping function. The flow of gas is shown at an angle of about 30 degrees with respect to a plane of the LDF 116. More generally, the angle of the gas flow is generally from 10 degrees to 45 degrees with respect to the plane of the LDF 116.

There is a space in the vertical dimension (90 degrees to the plane of the LDF 116) between the bottom of the LDF 116 and the top surface of the pressurized gas stopper 245 so that the LDF 116 can slide over the top surface of the pressurized gas stopper 245 without any physical contact. A range for this spacing can be from 2 to 15 mm. Air is a convenient choice for the gas. However, other gases may also be used, such as nitrogen ($N_2$).

Although shown in FIG. 2 on a single rail, disclosed pressurized gas stopper 245 can be placed on both rails 150a and 150b. A pressurized gas stopper 245 may also be oriented in other orientations relative to the orientation shown in FIG. 2, including 90 degrees to the translation direction of the LDF 116 extending from one rail 150a to the other rail 150b in one particular embodiment.

With a disclosed pressurized gas stopper 245, the above-described problems for conventional leadframe transport apparatus 100 can be avoided and LDF 116 can be effectively and smoothly stopped at desired position(s). The operating parameters for pressurized gas stopper gas flow applied to one particular pusher apparatus is a flow of 300 to 600 mm/s when the diameter of the air (or other gas) vent is about 1.5 to 4 mm, with the angle of the gas flow being 10 to 45 degrees with respect to a plane of the LDF 116, where the weight of LDF 116 is 5 to 30 grams.

The controller 230 provides control signals operable for controlling the flow of gas via actuator (e.g., solenoid) 236 which is coupled to gas valve 238 having a downstream flow sensor 243 to provide non-contact stopping of the LDF 116 at one or more locations along the machine track 160. Controller 230 also provides suitable control signals to machine pusher 144 and actuator 236 to provide the different operational states described below relative to FIGS. 3A-C.

Figure 3A:
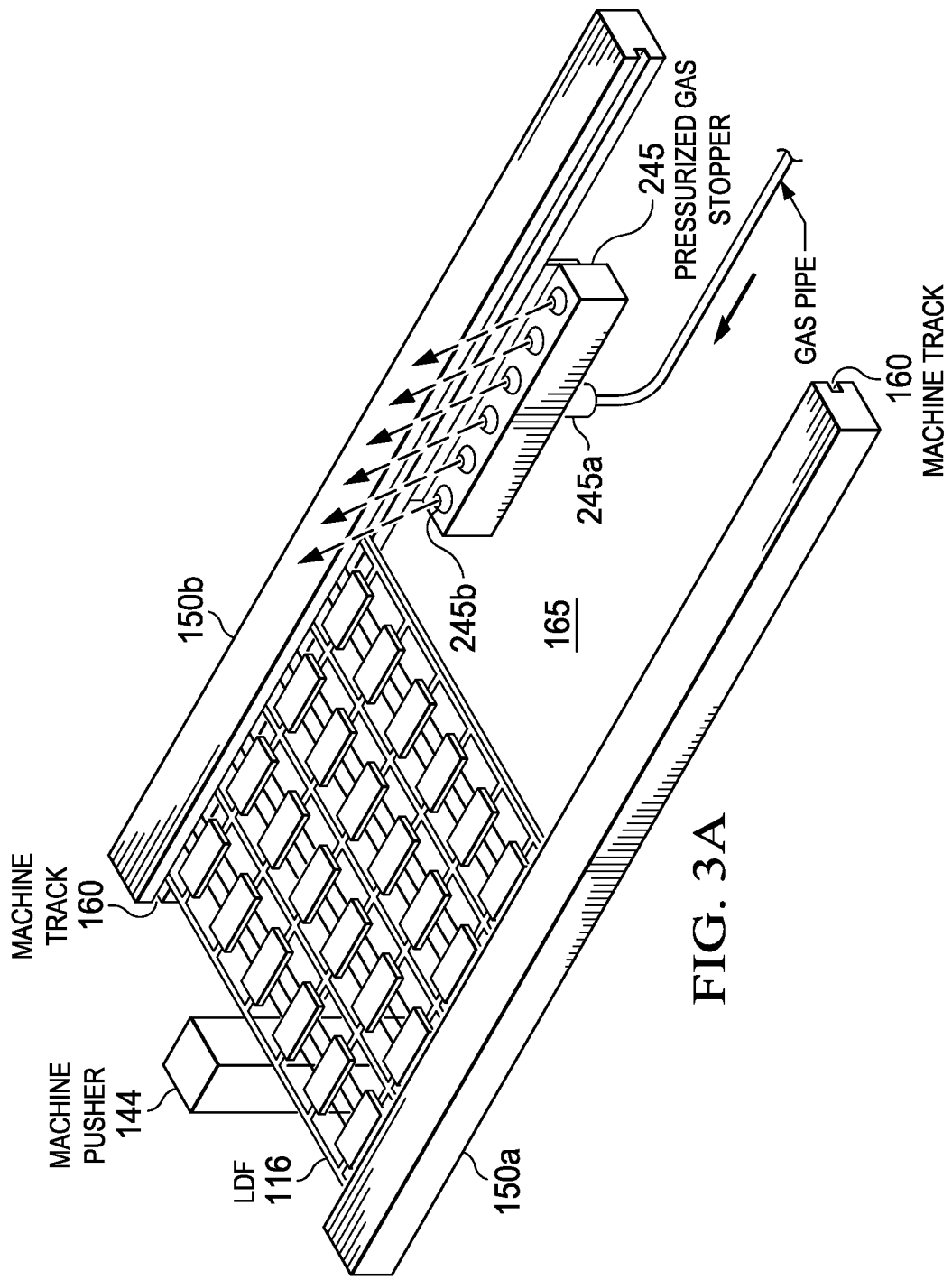
FIGS. 3A-C are perspective views of an example leadframe transport apparatus (without the functional blocks shown in FIG. 2), in operation while in different functional states, according to an example embodiment.
Figure 3B:
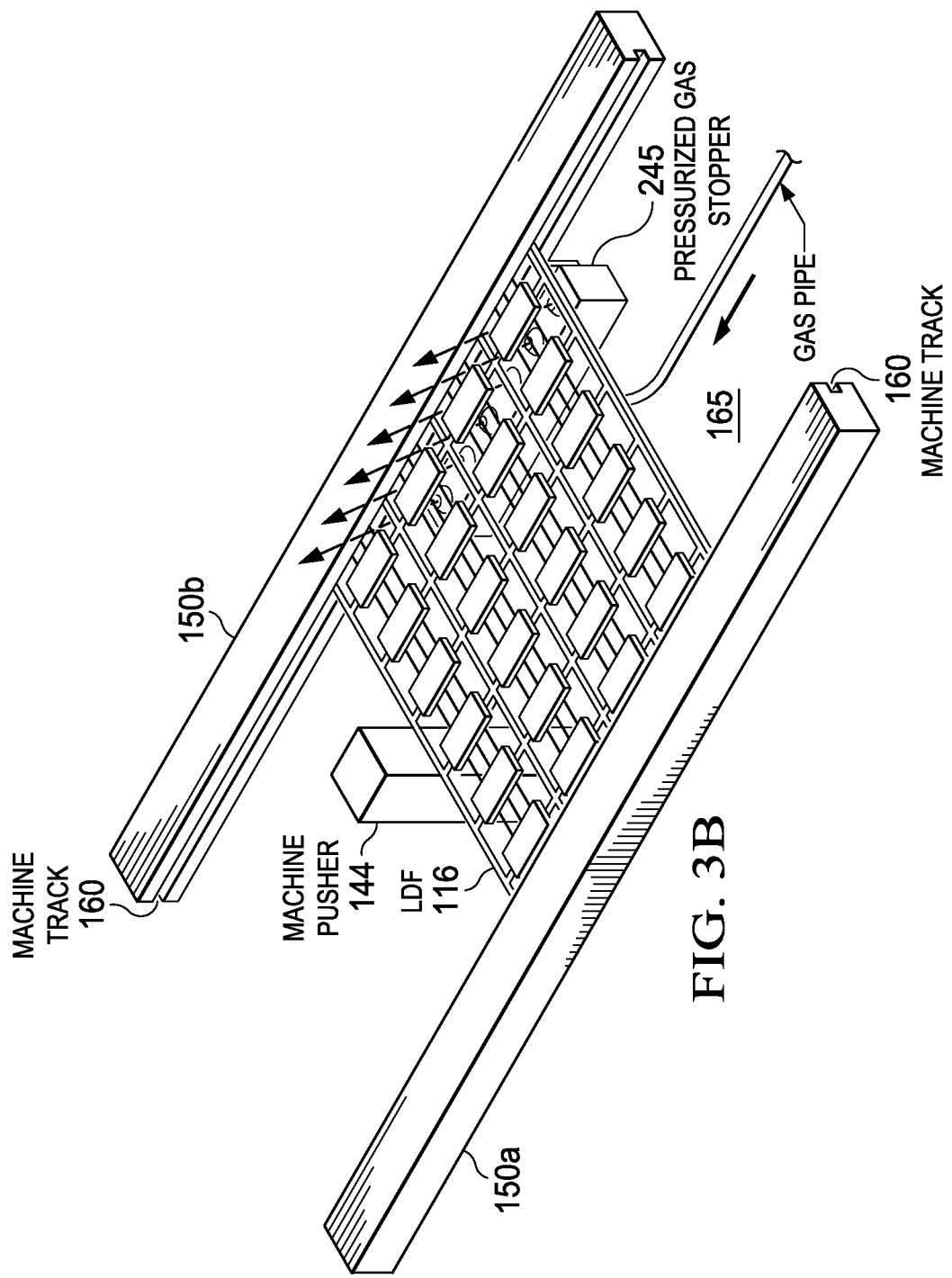
Figure 3C:
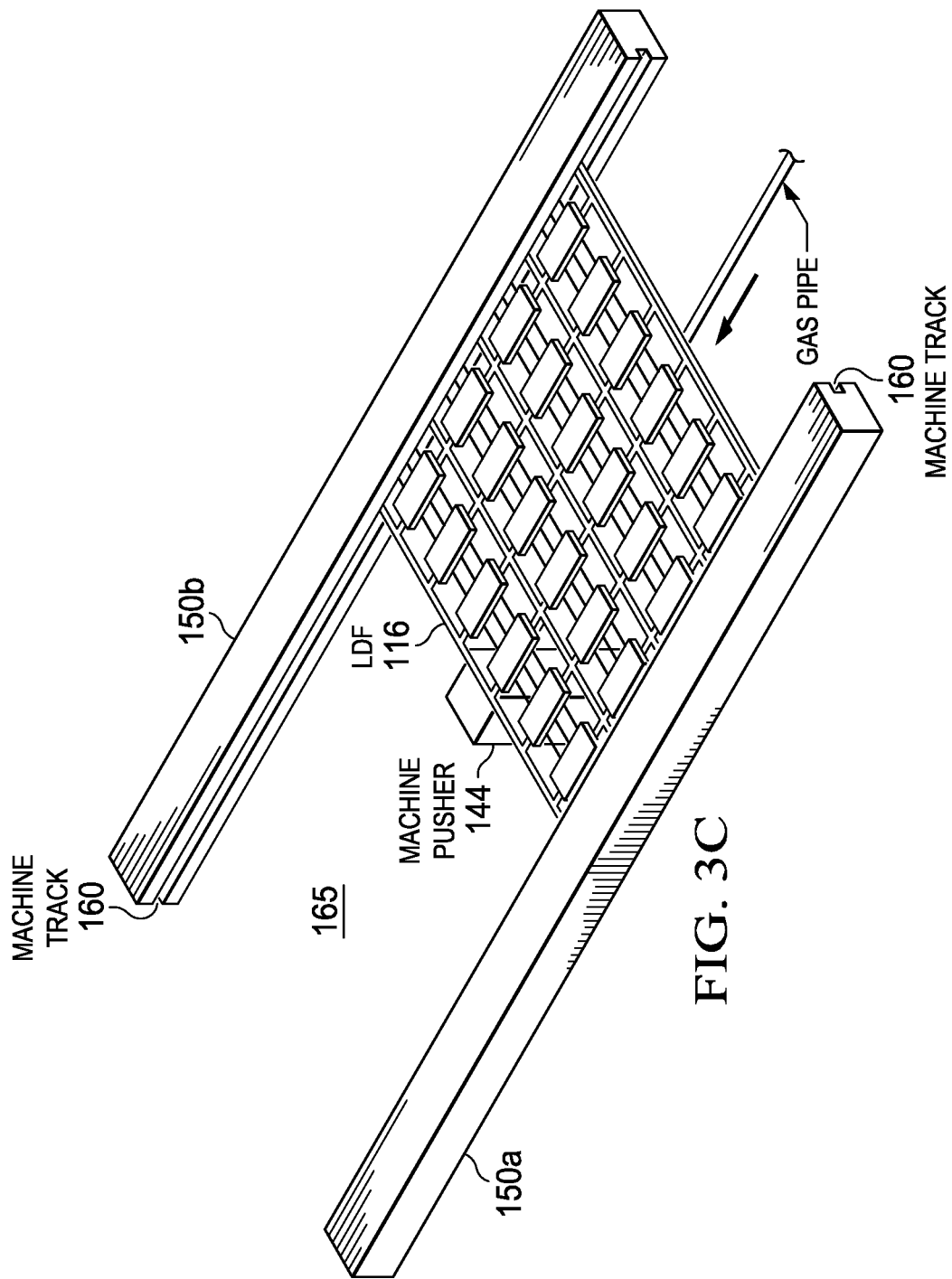

FIGS. 3A-C are perspective views of an example leadframe transport apparatus 200 (without the functional blocks shown in FIG. 2), in operation while in different functional states, according to an example embodiment. FIG. 3A shows the pressurized gas stopper 245 after automatically starting to flow gas through the gas outlets 245b while the LDF 116 is approaching the pressurized gas stopper 245. FIG. 3B shows the gas from the gas outlets 245b of the pressurized gas stopper 245 neutralizing the moving force of LDF 116 to provide a stop without inducing an orientation change which would result in the angular position of LDF 116 shifting. FIG. 3C shows the LDF 116 over the pressurized gas stopper 245 after automatically shutting off the gas flow at a time when the machine pusher 144 is in a down position (standby position), so that the LDF 116 is not being pushed and is thus stationary. At the position shown in FIG. 3C, The LDF 116 may be transferred to a die-bonding apparatus or wire bonding apparatus.

EXAMPLES

Experiments were performed on a LDF transport apparatus based on the example LDF transport apparatus 200 shown in FIG. 2. Air was used as the pressurized gas. Because the risk of jamming was reduced compared to conventional LDF transport apparatus having mechanical stoppers 100 shown in FIG. 1, it was possible to adjust machine parameters to increase the speed of pusher motor coupled to the machine pusher 144. An 11% units per hour (UPH) improvement was demonstrated compared to conventional LDF transport apparatus 100. A 71.3% LDF jam reduction was provided compared to conventional LDF transport apparatus 100. Downtime for the LDF transport apparatus 200 was also reduced 1.2% due to less jamming and adjustment compared to conventional LDF transport apparatus 100.

Disclosed embodiments can be integrated into a variety of assembly flows to form a variety of different semiconductor IC devices and related products. The assembly can comprise single semiconductor die or multiple semiconductor die, such as PoP configurations comprising a plurality of stacked semiconductor die. A variety of package substrates may be used. Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

I claim:

1. An apparatus for transporting a leadframe sheet during semiconductor die assembly, comprising:
   a rail having sub-rails defining a machine track and an inner space along which said leadframe sheet is adapted to move in a movement direction;
   at least one position detector adapted to sense a position of said leadframe sheet;
   a controller communicably coupled to said position detector and adapted to receive said position of said leadframe sheet, and
   a pressurized gas stopper positioned within said inner space including a gas distributor including at least one gas inlet for receiving a pressured gas supply and at least one gas outlet for directing a flow of gas against said movement direction and adapted to stop movement of said leadframe sheet.

2. The apparatus of claim 1, wherein said gas distributor comprises a gas manifold including a plurality of said gas outlets.

3. The apparatus of claim 2, wherein said plurality of said gas outlets is oriented at an angle ranging from 10 degrees to 45 degrees with respect to a plane of said machine track.

4. The apparatus of claim 1, wherein said pressurized gas stopper is exclusively used by said apparatus and adapted to stop said movement of said leadframe sheet.

5. The apparatus of claim 1, further comprising an actuator and a gas valve, wherein said controller provides control signals to said actuator which actuates said gas valve for controlling said flow of gas.

6. The apparatus of claim 5, further comprising a flow sensor downstream from said gas valve, wherein said flow sensor is communicably coupled to said controller for providing gas flow information to said controller, and said controller is communicably coupled to a machine pusher operable for moving said leadframe sheet in said movement direction.

7. The apparatus of claim 1, wherein said controller provides control signals operable for controlling said flow of gas.

8. The apparatus of claim 1, wherein said controller includes a processor.

9. The apparatus of claim 1, wherein said apparatus does not include clampers attached to said sub-rails.

10. A method of transporting a leadframe sheet during semiconductor die assembly, comprising:

sensing a position of said leadframe sheet as said leadframe sheet moves along a machine track of an apparatus for transporting leadframe sheets in a movement direction, said apparatus including an inner space provided by spaced apart sub-rails defining said machine track;

responsive to said position of said leadframe sheet reaching a predetermined location, providing a control signal operable for controlling a flow of gas through a pressurized gas stopper which when enabled directs said flow of gas toward said leadframe sheet sufficient to stop movement of said leadframe sheet.

11. The method of claim 10, wherein said pressurized gas stopper comprises a gas manifold including a plurality of gas outlets.

12. The method of claim 11, wherein said plurality of said gas outlets are oriented at an angle ranging from 10 degrees to 45 degrees with respect to a plane of said leadframe sheet.

13. The method of claim 10, wherein said pressurized gas stopper is exclusively used for stopping said movement of said leadframe sheet.

14. The method of claim 10, wherein a photoelectric sensor is used for said sensing said position of said leadframe sheet.

15. The method of claim 14, wherein said movement of said leadframe sheet is provided by a machine pusher including a pusher motor.

\* \* \* \* \*